United States Patent
Park et al.

(10) Patent No.: US 7,586,358 B2
(45) Date of Patent: Sep. 8, 2009

(54) LEVEL SHIFTER AND DRIVING METHOD

(75) Inventors: Kee-Chan Park, Anyang-si (KR);
Min-Koo Han, Seoul (KR); Woo-Jin Nam, Seongnam-si (KR); Jae-Hoon Lee, Seoul (KR)

(73) Assignees: Samsung Electronics Co., Ltd. (KR);
Seoul National University Industry Foundation (KR)

( * ) Notice: Subject to any disclaimer, the term of this patent is extended or adjusted under 35 U.S.C. 154(b) by 10 days.

(21) Appl. No.: 11/771,138

(22) Filed: Jun. 29, 2007

(65) Prior Publication Data

US 2008/0122516 A1    May 29, 2008

(30) Foreign Application Priority Data

Jul. 5, 2006    (KR) .................... 10-2006-0062865

(51) Int. Cl.
*H03L 5/00*    (2006.01)
(52) U.S. Cl. .................... 327/333; 326/68; 326/81
(58) Field of Classification Search ............. 327/333; 326/68, 81; 365/189.11
See application file for complete search history.

(56) References Cited

U.S. PATENT DOCUMENTS

| | | | | |
|---|---|---|---|---|
| 6,043,679 | A | * | 3/2000 | Kwon .................... 326/68 |
| 6,567,067 | B2 | | 5/2003 | Azami |
| 6,774,673 | B2 | | 8/2004 | Tsuboi et al. |
| 6,930,666 | B2 | * | 8/2005 | Miyazawa et al. .......... 327/333 |
| 7,265,581 | B2 | * | 9/2007 | Yeh .................... 327/333 |

FOREIGN PATENT DOCUMENTS

| | | |
|---|---|---|
| JP | 11017520 | 1/1999 |
| JP | 11177409 | 7/1999 |
| JP | 2002185305 | 6/2002 |
| JP | 2002353806 | 12/2002 |
| JP | 2004235995 | 8/2004 |
| JP | 2004343396 | 12/2004 |
| KR | 100241346 | 11/1999 |
| KR | 100538021 | 12/2005 |

* cited by examiner

*Primary Examiner*—Long Nguyen
(74) *Attorney, Agent, or Firm*—Cantor Colburn LLP

(57) ABSTRACT

A level shifter includes; a level conversion unit which receives a first input signal and a second input signal, wherein the second input signal is an inversion of the first input signal, and generates a first output signal having substantially a same phase of the first input signal and a voltage which is higher than the first input signal and a second output signal having substantially a same phase as the first input signal and a voltage which is lower than the first input signal; and wherein the level shifter further includes an amplifying unit which receives the first and second output signals and generates a third output signal having substantially a same phase as the first input signal and an amplitude which is greater than the first input signal.

19 Claims, 7 Drawing Sheets

LEVEL SHIFTER AND DRIVING METHOD

This application claims priority to Korean Patent Application No. 10-2006-0062865, filed on Jul. 5, 2006, and all the benefits accruing therefrom under 35 U.S.C. § 119, the contents of which in its entirety are herein incorporated by reference.

BACKGROUND OF THE INVENTION (a) Field of the Invention

The present invention relates to a level shifter.

(b) Description of the Related Art

An electrical device such as a display device includes a level shifter for changing a level of an input voltage to a level required for driving the display. Particularly, in the case of a polycrystalline thin film transistor ("TFT") flat panel display, in which driving units for generating electric signals to be applied to pixels are integrated on a substrate, a threshold voltage of the TFTs which form the driving units is high and electric field effect mobility is low, therefore a voltage which is higher than an input voltage should be applied to stably drive the driving units at a high speed.

Flat panel displays may come in several different varieties including liquid crystal displays ("LCDs"), field emission displays ("FEDs"), organic light emitting diode ("OLED") displays, plasma display panels ("PDPs"), and various other display types. In general, in an active flat panel display, a plurality of pixels are arranged in a matrix form, and an image is displayed by controlling luminance of each pixel according to applied image information.

A driving unit of the flat panel display receives a control signal and a source voltage from a signal controller and generates a scan signal and a data signal to be applied to pixels, and each level of the control signal and the source voltage are obtained by variably converting a level of the input voltage by using a level shifter.

However, conventionally the level shifter performs only a single operation for increasing or decreasing the input voltage, so in order to shift the input voltage in both directions, a complementary level shifter circuit is additionally required.

BRIEF SUMMARY OF THE INVENTION

The present invention provides a level shifter outputting a signal having greater amplitude than, and substantially the same phase as that of, an input signal.

An exemplary embodiment of the present invention provides a level shifter including; a signal conversion unit which receives a first input signal having a predetermined period and a second input signal which is an inversion of the first input signal, wherein the signal conversion unit generates a first output signal having substantially the same phase as that of the first input signal and having a voltage higher than that of the first input signal and a second output signal having substantially the same phase as that of the first input signal and having a voltage lower than that of the first input signal, and an amplifying unit which receives the first and second output signals and generates a third output signal having substantially the same phase as that of the first input signal and an amplitude greater than that of the first input signal.

The amplitudes of the first and second output signals may be substantially the same as those of the first and second input signals, respectively.

A minimum voltage level of the first output signal may be a first voltage which is higher than a minimum voltage level of the first input signal, and a maximum voltage level of the second output signal may be a second voltage which is lower than a maximum voltage level of the first input signal and lower than the first voltage.

The signal conversion unit may include; a first conversion unit which generates the first output signal based on the first and second input signals, and a second conversion unit which generates the second output signal based on the first and second input signals.

The first conversion unit may include; a first transistor which transfers the first voltage to a first output terminal, a first capacitor which turns the first transistor on and off according to the second input signal, and a second capacitor which increases a voltage of the first output terminal according to the first input signal. The second conversion unit may include; a second transistor which transfers the second voltage to a second output terminal, a third capacitor which turns the second transistor on and off according to the second input signal, and a fourth capacitor which lowers a voltage of the second output terminal according to the first input signal.

The first conversion unit may further include; a third transistor which transfers the first voltage to a third output terminal according to the voltage of the first output terminal, and the second conversion unit may further include; a fourth transistor which transfers the second voltage to a fourth output terminal according to the voltage of the second output terminal.

The first capacitor increases a voltage of the third output terminal according to the second input signal, and the third capacitor lowers a voltage of the fourth output terminal according to the second input signal.

The amplifying unit may include; a first switching transistor which transfers a third voltage according to the first output signal and a second switching transistor which transfers a fourth voltage according to the second output signal, wherein the first and second switching transistors can be alternately turned on and off.

The first and third transistors have a conductive type opposite of the conductive type of the second and fourth transistors.

The level shifter may further include a buffer which receives the third output signal.

The first voltage may be lower than the third voltage, the second voltage may be higher than the fourth voltage, and the first and third transistors can be n-type transistors.

The first and third voltages may be substantially the same, the second and fourth voltages may be substantially the same, and the first and third transistors may be p-type transistors.

Another exemplary embodiment of the present invention provides a level shifter including; a pair of first capacitors connected in series and having first and second terminals, a pair of second capacitors connected in series and having first and second terminals, a first transistor having a control terminal connected with the first terminal of the pair of second capacitors, a first input/output terminal connected with a first voltage, and a second input/output terminal connected with the first terminal of the pair of first capacitors, a second transistor which has a conductive type opposite the first transistor, and which has a control terminal connected with the second terminal of the pair of second capacitors, a first input/output terminal connected with a second voltage, and a second input/output terminal connected with the second terminal of the pair of first capacitors, a third transistor having a control terminal connected with the first terminal of the pair of first capacitors, a first input/output terminal connected with a third voltage, and a second input/output terminal, and a fourth transistor having a control terminal connected with the second terminal of the pair of first capacitors, a first input/output terminal connected with a fourth voltage, and a second input/output terminal connected with the second input/output terminal of the third transistor, wherein a contact between the pair of first capacitors is connected with a first input signal and a contact between the pair of second capacitors is connected with a second input signal, wherein the second input signal is an inversion of the first input signal.

The level shifter may further include; a fifth transistor of substantially the same conductive type as the first transistor, and having a control terminal connected with the first terminal of the pair of first capacitors, a first terminal connected with a first voltage, and a second terminal connected with the first terminal of the pair of second capacitors, and a sixth transistor of substantially the same conductive type as the second transistor, and having a control terminal connected with the second terminal of the pair of first capacitors, a first terminal connected with the second voltage, and a second terminal connected with the second terminal of the pair of second capacitors.

The first voltage may be lower than a first reference voltage, the second voltage may be higher than a second reference voltage, and the first and fifth transistors can be n-type transistors.

The first voltage and the first reference voltage may be substantially the same and the second voltage and the second reference voltage may be substantially the same, and the first and fifth transistors can be p-type transistors.

Yet another exemplary embodiment of the present invention provides a method of driving a level shifter including; receiving a first periodic input signal, receiving a second input signal, wherein the second input signal is an inversion of the first input signal, generating a first output signal, wherein the first output signal has substantially the same phase as that of the first input signal and a voltage which is higher than that of the first input signal, generating a second output signal, wherein the second output signal has substantially the same phase as that of the first input signal and a voltage which is lower than that of the first input signal according to the first and second input signals, and receiving the first and second output signals and generating a third output signal which has substantially the same phase as that of the first input signal and an amplitude which is greater than that of the first input signal.

The amplitudes of the first and second output signals may be substantially the same as those of the first and second input signals, respectively.

A minimum voltage level of the first output signal can be a first voltage which is higher than a minimum voltage level of the first input signal, and a maximum voltage level of the second output signal may be the second voltage which is lower than a maximum voltage level of the first input signal and lower than the first voltage.

The generating of the first output signal may include; transferring the first voltage to a first output terminal according to the second input signal, and increasing a voltage of the first output terminal according to the first input signal. The generating of the second output signal may include transferring the second voltage to a second output terminal according to the second input signal, and reducing the voltage of the second output terminal according to the first input signal.

The generating of the third output signal may include; transferring a third voltage according to the first output signal and transferring a fourth voltage according to the second output signal, wherein the third and fourth voltages can be alternately transferred.

BRIEF DESCRIPTION OF THE DRAWINGS

The present invention will become more apparent by further describing exemplary embodiments thereof with reference to the accompanying drawings, in which.

DETAILED DESCRIPTION OF THE INVENTION

Figure 1:
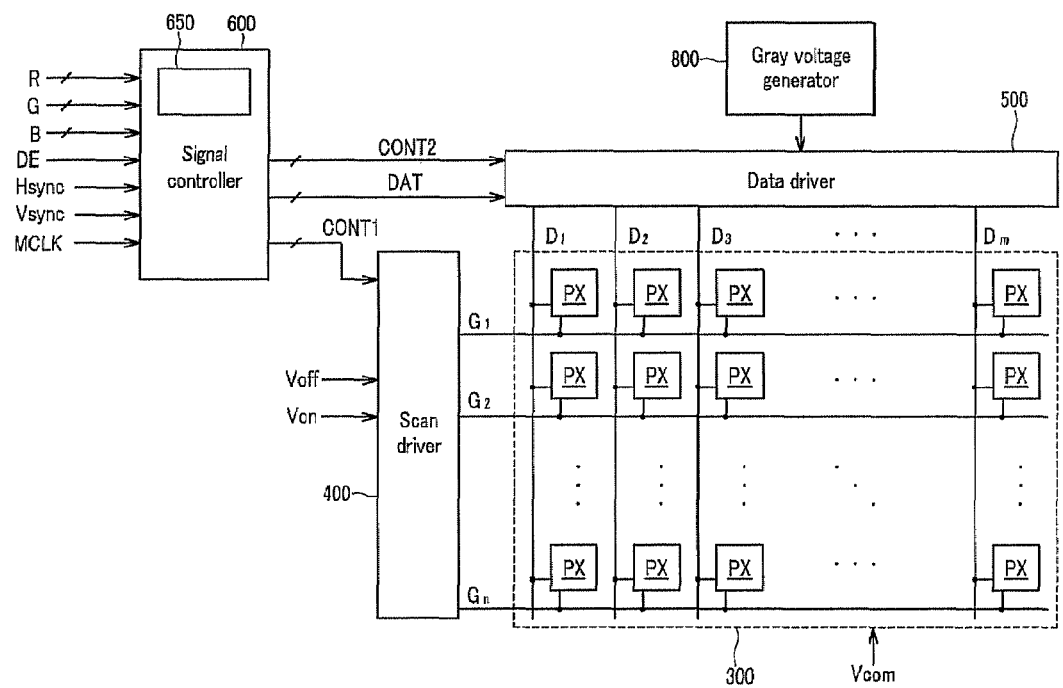
FIG. 1 is a schematic block diagram showing an exemplary embodiment of a display device according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another one element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

The present invention will now be described more fully hereinafter with reference to the accompanying drawings, in which preferred embodiments of the invention are shown.

An exemplary embodiment of a display device according to the present invention will now be described with reference to FIGS. 1 and 2.

Figure 2:
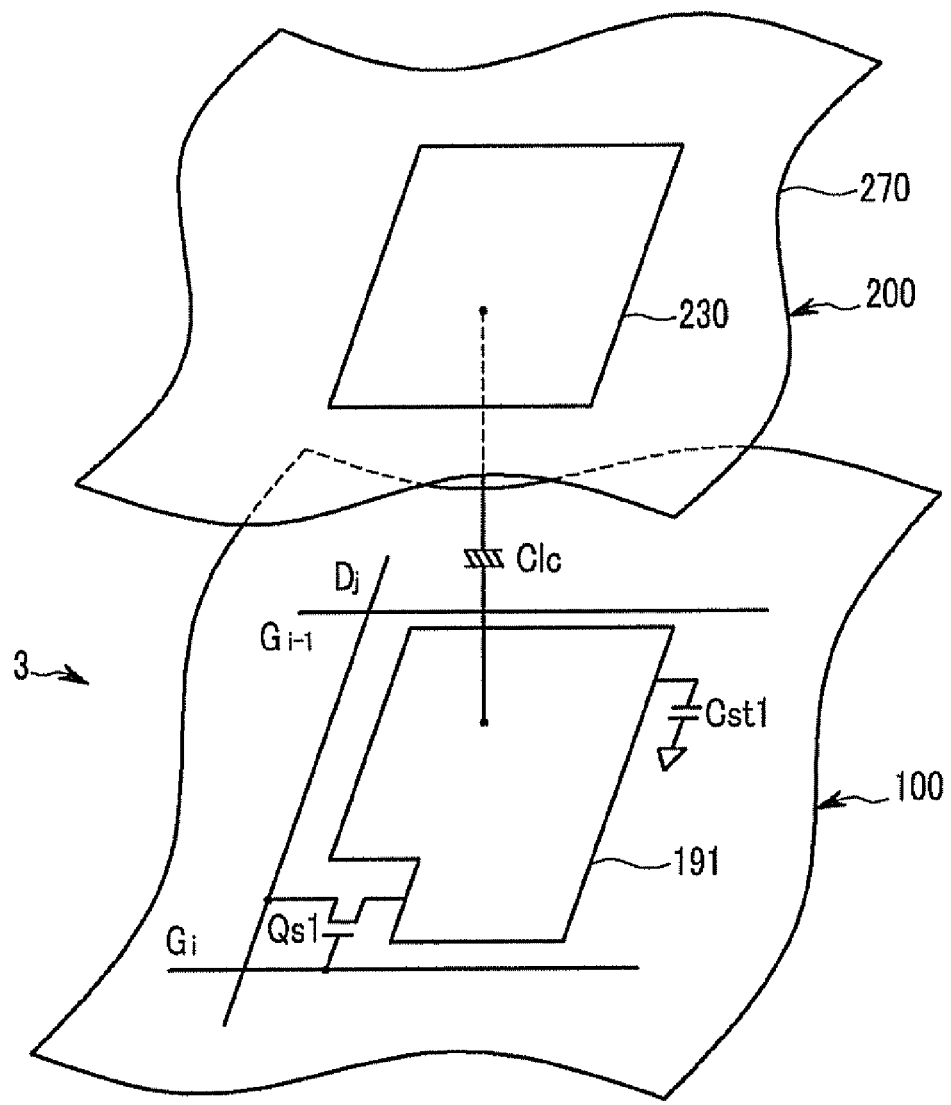
FIG. 2 is an equivalent circuit diagram of an exemplary embodiment of a pixel of an exemplary embodiment of a liquid crystal display ("LCD") according to the present invention.

FIG. 1 is a schematic block diagram showing an exemplary embodiment of a display device according to the present invention, and FIG. 2 is an equivalent circuit diagram of an exemplary embodiment of a pixel of an exemplary embodiment of a liquid crystal display ("LCD") according to the present invention.

As shown in FIG. 1, an exemplary embodiment of a display device according to the present invention includes a display panel assembly 300, a scan driver 400 and a data driver 500 connected with the display panel assembly 300, a gray voltage generator 800 connected with the data driver 500, and a signal controller 600 for controlling them.

In view of the equivalent circuit diagram of FIG. 2, the display panel assembly 300 includes a plurality of signal lines $G_1$-$G_n$ and $D_1$-$D_m$ and a plurality of pixels PX arranged in a substantially matrix form. Referring to a pixel of an LCD as shown in FIG. 2, the display panel assembly 300 includes lower and upper panels 100 and 200 which face each other, and a liquid crystal layer 3 interposed therebetween.

The signal lines $G_1$-$G_n$ and $D_1$-$D_m$ include a plurality of scan lines $G_1$-$G_n$ which transfer scan signals and a plurality of data lines $D_1$-$D_m$ which transfer data signals. The scan lines $G_1$-$G_n$ extend substantially in a row direction and substantially parallel to each other, and the data lines $D_1$-$D_m$ extend substantially in a column direction and substantially parallel to each other.

Alternative exemplary embodiments include configurations wherein the signal lines $G_1$-$G_n$, $D_1$-$D_m$ further include a voltage line (not shown) for transferring a voltage.

With reference to FIG. 2, each pixel, for example, a pixel PX connected with the $i^{th}$ (i=1, 2, ..., n) scan line $G_1$ and the $j^{th}$ (j=1, 2, ..., m) data line $D_j$, includes a switching element Qs1 connected with the signal lines $G_1$ and $D_j$ and a pixel circuit connected thereto.

The switching element Qs1 is a three-terminal element such as a thin film transistor ("TFT") provided on the lower panel 100. The switching element includes a control terminal connected with the scan line $G_i$, an input terminal connected with the data line $D_j$, and an output terminal connected with the pixel circuit. Exemplary embodiments of the TFT may include polycrystalline silicon or amorphous silicon.

The pixel circuit shown in FIG. 2 includes a liquid crystal capacitor Clc and a storage capacitor Cst1. Alternative exemplary embodiments include configurations where the storage capacitor Cst1 is omitted.

The liquid crystal capacitor Clc includes a pixel electrode 191 on the lower panel 100 and a common electrode 270 on the upper panel 200 as two terminals, and the liquid crystal layer 3 between the two electrodes 191 and 270 selves as a dielectric material. The pixel electrode 191 is connected with the switching element Qs1 and the common electrode 270 is formed on substantially the entire surface of the upper panel 200 and receives a common voltage (Vcom). Alternative exemplary embodiments include configurations wherein the common electrode 270 is provided on the lower panel 100, and in such an exemplary embodiment, at least one of the two electrodes 191 and 270 can be formed in a linear or bar shape.

The storage capacitor Cst1, which serves as an auxiliary to the liquid crystal capacitor Clc, is formed as a separate signal line (not shown) provided on the lower panel 100, and the pixel electrode 191 overlaps an insulator interposed therebetween. A predetermined voltage such as the common voltage Vcom or other similar voltage is applied to the separate signal line. Also, the storage capacitor Cst1 may be formed by overlapping the pixel electrode 191 with the previous scan line with an insulating medium disposed therebetween.

At least one polarizer (not shown) for polarizing light is attached on an outer surface of the display panel assembly 300 of the LCD.

In order to implement a color display, each pixel PX specifically displays one of a variety of primary colors (spatial division) or pixels PX alternately display the primary colors over time (temporal division), so that a desired color can be recognized by the spatial or temporal sum of the primary colors. In one exemplary embodiment the primary colors may be the three primary colors of the red, green, and blue.

FIG. 2 shows one example of the spatial division in which each pixel PX includes a color filter 230 which displays one of the primary colors at a region of the upper panel 200 corresponding to the pixel electrode 191. Alternative exemplary embodiments of the color filter 230 include configurations where the color filter 230 is formed above or below the pixel electrode 191 of the lower panel 100.

Referring back to FIG. 1, the gray voltage generator 800 generates a set of gray voltages (or a set of reference gray voltages) related to transmittance of the pixels PX. The transmittance of the pixels PX may refer to the amount of light allowed to pass through the liquid crystal layer 3 via the twisting of liquid crystals of the liquid crystal layer 3 or to the luminosity of the light generated by the OLED LD, or other methods of transmittance used in various types of displays.

The scan driver 400 is connected with the scan lines $G_1$-$G_n$ of the display panel assembly 300 and applies a scan signal including a combination of a gate-on voltage Von and a gate-off voltage Voff to the scan lines $G_1$-$G_n$.

The data driver 500 is connected with the data lines $D_1$-$D_m$ of the display panel assembly 300, and it selects a gray voltage from the gray voltage generator 800 and applies it as a data voltage to the data lines $D_1$-$D_m$.

The signal controller 600 controls the scan driver 400 and the data driver 500. The signal controller 600 includes a level shifter 650 for converting a voltage level of an input signal to generate an output signal.

The drivers 400, 500, 600, and 800 can be integrated with the display panel assembly 300 together with the signal lines $G_1$-$G_n$ and $D_1$-$D_m$ and the TFT switching element Qs1. Alternative exemplary embodiments include configurations wherein the drivers 400, 500, 600 and 800 are directly mounted on the display panel assembly 300 as an IP chip, or wherein they are mounted on a flexible printed circuit film (not shown) so as to be attached as a tape carrier package ("TCP") on the liquid crystal panel assembly 300, or wherein they are mounted on a printed circuit board ("PCB") (not shown). In addition, the drivers 400, 500, 600 and 800 may be integrated as a single chip, and such an exemplary embodiment, at least one circuit of at least one or more of them can be positioned outside the single chip.

The operation of such display device will be described in detail as follows.

With reference to FIG. 1, The signal controller 600 receives input image signals (R, G, and B) and an input control signal for controlling display thereof from an external graphics controller (not shown). The input image signals R, G, and B include luminance information for each pixel PX, and luminance includes a determined number of gray levels, e.g., 1024 ($=2^{10}$), 256 ($=2^8$), or 64 ($=2^6$) gray levels. The input control signals include, for example, a vertical synchronization signal Vsync, a horizontal synchronization signal Hsync, a main clock signal MCLK, and a data enable signal DE, and various other signals.

The signal controller 600 appropriately processes the input video signals R, G, and B according to operating conditions of the display panel assembly 300 based on the input video signals R, G, and B and the input control signal, generates a gate control signal CONT1, a data control signal CONT2, and processed image data DAT, and transmits the gate control signal CONT1 to the scan driver 400 and transmits the data control signal CONT2 and the processed digital image data DAT to the data driver 500.

The gate control signal CONT1 includes a scanning start signal STV for instructing starting of scanning and at least one clock signal for controlling an output period of the gate-on voltage Von. In one exemplary embodiment, the gate control signal CONT1 may additionally include an output enable signal OE for limiting duration of the gate-on voltage Von.

The data control signal CONT2 includes a horizontal synchronization start signal STH for informing of starting of transmission of the digital image signal DAT to one row of pixels PX, a load signal LOAD for indicating applying of an analog data voltage to the data lines $D_1$-$D_m$, and a data clock signal HCLK. The data control signal CONT2 may additionally include an inversion signal RVS for inverting polarity of an analog data voltage with respect to the common voltage Vcom (which is called "polarity of a data voltage").

The data driver 500 receives the digital image signal DAT with respect to one row of pixels PX according to the data control signal CONT2 received from the signal controller 600, selects a gray voltage corresponding to each digital image signal DAT, converts the digital image signal DAT into an analog data voltage, and applies it to the corresponding data lines $D_1$-$D_m$.

The scan driver 500 applies a gate-on voltage to the scan lines $G_1$-$G_n$ according to the gate control signal CONT1 from the signal controller 600 to turn on the switching elements Qs1 connected with the scan lines $G_1$-$G_n$. Then, the data voltage, which has been applied to the data lines $D_1$-$D_m$ is applied to the corresponding pixels PX through the turned-on switching elements Qs1.

A difference between the data voltage applied to the pixels PX and the common voltage Vcom appears as a charge voltage of the liquid crystal capacitor Clc, namely, as a pixel voltage. Arrangement of liquid crystal molecules is changed according to the size of the pixel voltage, and polarization of light that transmits through the liquid crystal layer 3 is changed accordingly. The change in the polarization appears as a change in transmittance of light by a polarizer attached on the display panel 300, through which the pixels PX display luminance represented by gray levels of the image signal DAT. The level shifter 650 will be described in detail with reference to FIGS. 3 to 5.

Figure 3:
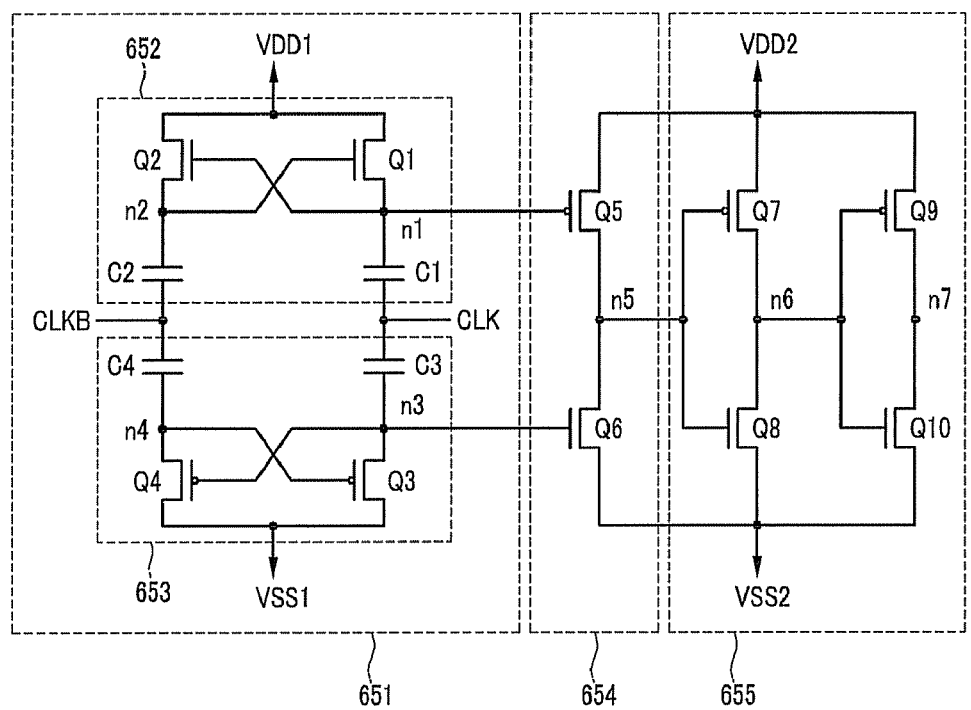
FIG. 3 is a circuit diagram of an exemplary embodiment of a level shifter of a signal controller according to the present invention.

FIG. 3 is a circuit diagram of an exemplary embodiment of a level shifter of a signal controller according to the present invention.

Referring to FIG. 3, the exemplary embodiment of a level shifter 650 according to the present invention includes a signal conversion unit 651, an amplifying unit 654, and a buffer 655.

The signal conversion unit 651 receives first and second input signals CLK and CLKB respectively, and ultimately outputs a signal with larger voltage amplitude than the input signals. The signal conversion unit includes first and second conversion units 652 and 653 which are formed substantially symmetrically with one another.

A first conversion unit 652 includes a pair of transistor-capacitor combinations including transistors Q1 and Q2 and capacitors C1 and C2, respectively, and it increases the first input signal CLK based on a first high voltage VDD1.

In the present exemplary embodiment the transistors Q1 and Q2 are n-type transistors and include an input terminal connected with the first high voltage VDD1, an output terminal connected with contacts n1 and n2 respectively, and a control terminal connected with the contacts n2 and n1, respectively.

The capacitors C1 and C2 are connected between the first and second input signals CLK and CLKB and the contacts n1 and n2, respectively.

The first and second input signals CLK and CLKB can have mutually opposite phases.

A second conversion unit 653 decreases the first input signal CLK based on a first low voltage VSS1, and is connected with the first conversion unit 652. The second conversion unit 653 also includes a pair of transistor-capacitor combinations including transistors Q3 and Q4 and capacitors C3 and C4, respectively.

In the present exemplary embodiment the transistors Q3 and Q4 are p-type transistors, and include an input terminal connected with the first low voltage VSS1, an output terminal connected with contacts n3 and n4, and a control terminal connected with the contacts n4 and n3, respectively.

The capacitors C3 and C4 are connected between the first and second input signals CLK and CLKB and the contacts n3 and n4, respectively.

The amplifying unit 654 is connected in series between a second high voltage VDD2 and a second low voltage VSS2, and includes two transistors Q5 and Q6 which have mutually opposite conductivity. The amplifying unit 654 generates an output signal with an amplitude which is greater than that of the first input signal CLK upon receiving voltages of the contacts n1 and n3.

In this exemplary embodiment, the transistor Q5 is a p-type transistor, and it includes an input terminal connected with a second high voltage VDD2, an output terminal connected with a contact n5, and a control signal connected with the contact n1.

In this exemplary embodiment, the transistor Q6 is an n-type transistor and includes an input terminal connected with a second low voltage VSS2, an output terminal connected with the contact n5, and a control terminal connected with the contact n3.

A voltage of the contact n5 becomes an output signal of the amplifying unit 654.

Figure 4:
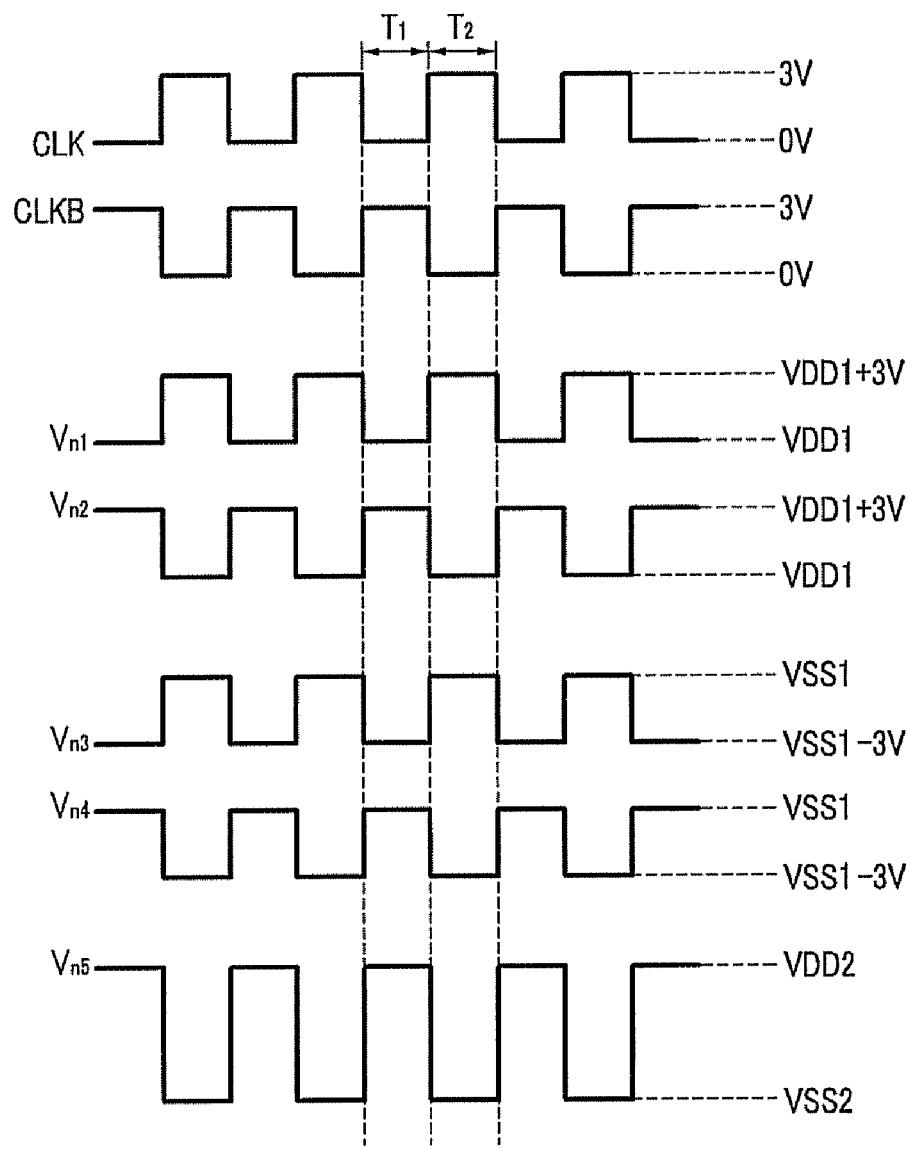
FIG. 4 is a view of a signal waveform showing an operation of the exemplary embodiment of a level shifter of FIG. 3.

The buffer 655 is connected with the amplifying unit 654 and stabilizes an output of the amplifying unit 654. As shown in FIG. 4, the buffer 655 has a structure in which two inverters, each including two transistors, namely, one inverter including transistors Q7 and Q8 and another inverter including transistors Q9 and Q10, are connected in series. The buffer 655 is biased by the second high voltage VDD2 and the second low voltage VSS2, and an output terminal n7 of the buffer 655 becomes an output terminal n7 of the level shifter 650.

The operation of the level shifter 650 in FIG. 3 will now be described with reference to FIG. 4.

FIG. 4 is a view of a signal waveform showing an operation of the an exemplary embodiment of a level shifter of FIG. 3.

With reference to FIG. 4, an exemplary embodiment of the first input signal CLK is a clock signal ranging (reciprocating) from a high voltage of about 3 V to a low voltage of about 0 V, and the second input signal CLKB is an inverse of the first input signal CLK. In the present exemplary embodiment the first voltage VDD1 is about 3 V, the first low voltage VSS1 is about 0 V, the second high voltage VDD2 is about 6 V, and the second low voltage VSS2 is about −3 V. However, it will be understood that these voltage values can be varied.

At a first interval T1, when the first input signal CLK transitions from about 3 V to about 0 V and accordingly the second input signal CLKB transitions from about 0 V to about 3 V, the capacitor C2 of the first conversion unit 652 develops a voltage Vn2 at the contact n2 substantially equal to a voltage build-up swing, or the change in voltage, of the second input signal CLKB. Then, the transistor Q1 is turned on to transfer the first high voltage VDD1 to the contact n1, making the voltage vn1 at the contact n1 become about 3V. Because there is no voltage difference between a gate and a source in the transistor Q2, the transistor Q2 is turned off and the voltage of the capacitor C2 is set at the contact n2.

In the second conversion unit 653, the first input signal CLK transitions from about 3 V to about 0 V, so the capacitor C3 lowers a voltage Vn3 at the contact n3 as much as a build-down swing, or change in voltage, of the first input signal CLK. Accordingly, the transistor Q4 is turned on to transfer the first low voltage VSS1 to the contact n4. Thus, a voltage Vn4 at the contact n4 becomes about 0 V. At this time, there is no voltage difference between a gate and a source of the transistor Q3, and the transistor Q3 is turned off and the first low voltage of about 0 V is lowered by the voltage stored in the capacitor C3 of about −3 V and a voltage of about −3 V is set at the contact n3.

Next, at the second interval T2, when the first input signal CLK transitions from about 0 V to about 3 V and the second input signal CLKB transitions from about 3 V to about 0 V, the first and second conversion units 652 and 653 perform operations opposite to those at the first interval T1.

Accordingly, in the first conversion unit 652, the transistor Q1 is turned off and thus the voltage Vn1 at the contact n1 becomes a value that has been increased by the capacitor C1 by as much as the swing of the first input signal CLK, namely, about 3 V; thereby the voltage at the contact n1 is equal to the first high voltage of about 3 V plus the swing of the first input signal CLK of about 3 V resulting in a total voltage of about 6V. Then, the transistor Q2 is turned on, and accordingly, the voltage Vn2 at the contact n2 becomes about 3 V, which is the same as first high voltage VDD1. In the second conversion unit 653, because the transistor Q3 is turned on, the voltage Vn3 at the contact n3 becomes about 0 V, which is substantially the same as the first low voltage VSS1, and because the transistor Q4 is accordingly turned off, the voltage Vn4 at the contact n4 becomes a voltage which has been lowered by the capacitor C4 by as much as the swing of the second input signal CLKB, namely about −3 V; thereby the voltage at the contact n4 is equal to the first low voltage VSS1 of about 0 V plus the swing of the second input signal CLKB of about −3 V resulting in a total voltage of about −3 V.

In this manner, the signal conversion unit 651 obtains a signal at the contact n1 which has substantially the same phase and substantially the same amplitude as that of the first input signal CLK but at a higher voltage, e.g. a signal ranging from about 3 V to about 6 V, and a signal at the contact n3 which has substantially the same phase and substantially the same amplitude as that of the first input signal CLK but at a lower voltage, e.g. a signal ranging from about 0 V to about −3 V. In addition, in the signal conversion unit 651, a signal which is substantially an inversion of the signal at the contact n1, can be obtained at the contact n2, and an inverse of the signal at the contact n3 can be obtained at the contact n4.

In the amplifying unit 654, the two transistors Q5 and Q6 receive the voltages Vn1 and Vn3 of the contacts n1 and n3, respectively, and are selectively turned on according to intervals T1 and T2.

At the first interval T1, as the contact voltage Vn1 of about 3 V is applied to the control terminal of the transistor Q5, the transistor Q5 is turned on, and because there is no voltage difference between a source and a gate of the transistor Q6, the transistor Q6 is turned off. Accordingly, at the first interval T1, the second high voltage VDD2 is transferred to the contact n5 through the transistor Q5.

At the second interval T2, the transistors Q5 and Q6 are operated in the opposite manner to the first interval T1. That is, because there is no voltage difference between the source and the gate of the transistor Q5, the transistor Q5 is turned off, while the transistor Q6 receives the contact voltage Vn3 of about 0 V so as to be turned on to transfer the second low voltage VSS2 to the contact n5.

Accordingly, the voltage of the contact n5, namely Vn5, is about 6 V at the first interval T1 and about −3 V at the second interval T2. In this manner, the amplifying unit 654 has the same phase as that of the second input signal CLKB and outputs a signal ranging from about 6 V to about −3 V.

Referring to the operation of the buffer 655, because the output voltage of the amplifying unit 654 is about 6 V at the first interval T1, the transistor Q8 is turned on (the transistor Q7 is turned off) and transfers about −3V, which is the second reference voltage VSS2, to the contact n6, and accordingly the transistor Q9 is turned on (the transistor Q10 is turned off) and outputs about 6 V, which is the second high voltage VDD2, to the output terminal n7.

At the second interval T2, because the output voltage of the amplifying unit 654 is about −3 V, the transistor Q7 is turned on (the transistor Q8 is turned off) to transfer the first reference voltage VDD2 to the contact n6, and accordingly the transistor Q10 is turned on (the transistor Q9 is turned off) to output about −3 V, which is the second low voltage VSS2; to the output terminal n7.

Accordingly, the output signal of the level shifter 650 has the same phase as that of the second input signal CLKB and ranges from about 6 V to about −3 V.

In alternative exemplary embodiments of the level shifter 650, in order to obtain an output signal having the same phase as that of the first input signal CLK, the voltage of the contact n6 can be outputted as an output signal (in this case, the rear inverter can be omitted), or in order to obtain a stable signal, another inverter can be additionally formed behind the rear inverter.

At the beginning of the operation of the level shifter 650 an arbitrary voltage is set at the contacts n1 and n2 before the first and second input signals CLK and CLKB are applied. These arbitrary voltages are artifacts of the voltages stored in capacitors C1 and C2 which may vary if stored for long periods of time. When the first and second input signals CLK and CLKB are first applied, an abnormal state arises due to these arbitrary voltages at the contacts n1 and n2 and continues during a certain time. Namely, although the second input signal CLKB transitions to about 3 V at the first interval T1 to increase the voltage Vn2 at the contact n2, the increased voltage can be lower than about 6 V due to the arbitrary voltage previously applied at n2, so the transistor Q1 may output a weak current to the contact n1. Accordingly, a voltage which is lower than the first high voltage VDD1 is set at the contact n1. Subsequently, when the second interval T2 starts, the capacitor C1 increases the voltage Vn1 at the contact n1 by about 3 V, and the transistor Q2 is weakly turned on to apply a weak current to the contact n2 to increase the voltage Vn2 of the contact n2. Accordingly, the voltages at the contacts n1 and n2 repeatedly increase at arbitrary voltages with the lapse of additional time intervals. Eventually the voltages at the contacts n1 and n2 develop the normal state ranging from about 3 V to about 6 V. Similarly the voltages at the contacts n3 and n4 repeatedly decrease at arbitrary voltages with the lapse of additional time intervals to achieve the normal state ranging from about 0 V to about −3 V. The abnormal state thus appears for merely a short time, which can be disregarded.

Therefore, in the exemplary embodiment of the level shifter 650 according to the present invention, with respect to the input signals CLK and CLKB, an output signal Vn7, whose amplitude as well as its voltage value has been increased, is generated so a signal shifted in the positive and negative directions can be obtained without using a separate complementary circuit.

A level shifter according to a different embodiment of the present invention will be described in detail with reference to FIG. 5.

Figure 5:
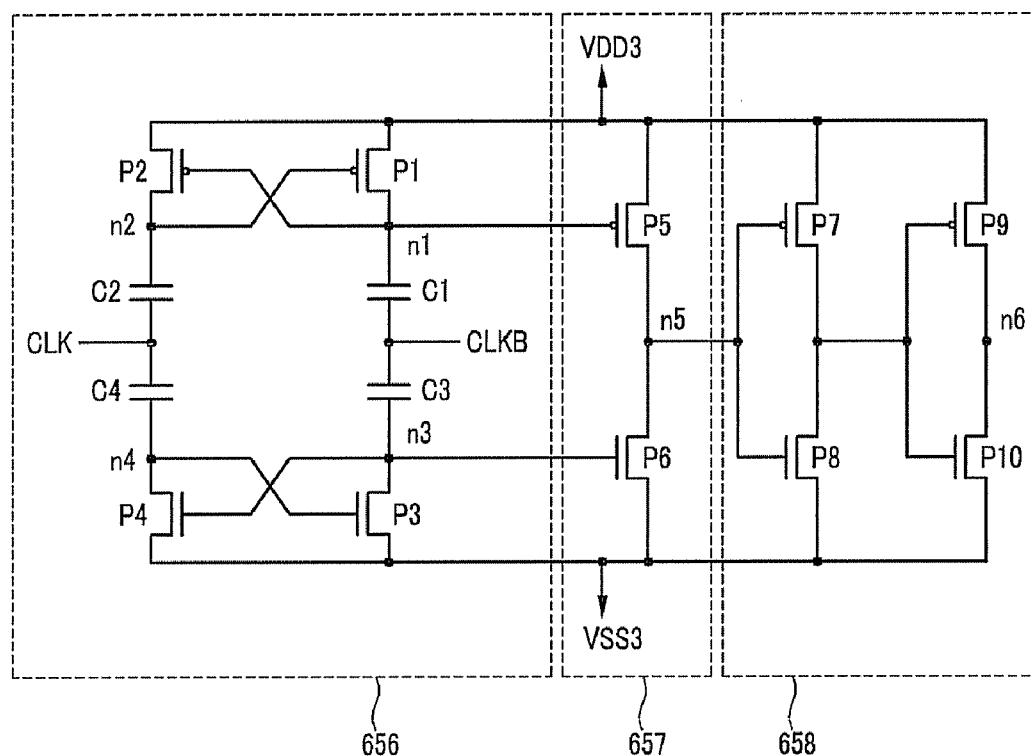
FIG. 5 is an equivalent circuit diagram of another exemplary embodiment of a level shifter of a signal controller according to the present invention.

FIG. 5 is an equivalent circuit diagram of another exemplary embodiment of a level shifter of a signal controller according to the present invention.

With reference to FIG. 5, the exemplary embodiment of a level shifter according to the present invention includes a signal conversion unit 656, an amplifying unit 657, and a buffer 658.

The level shifter 660 in FIG. 5 has almost the same circuit structure as that of FIG. 3. Namely, the level shifter 650 includes a signal conversion unit 656, an amplifying unit 657, and a buffer 658.

Compared with the level shifter 650 as shown in FIG. 3, the level shifter 660 in FIG. 5 is constructed such that the transistors P1-P2 and P3-P4 have the opposite conductive type of transistors Q1-Q2 and Q3-Q4 of FIG. 4, e.g. p-types are substituted for n-types and vice versa, and input points of the first input signal CLK and the second input signal CLKB are mutually changed. In addition, the high voltage VDD1 and the low voltage VSS1 applied to the signal conversion unit 656 are the same as the high voltage VDD3 and the low voltage VSS3 applied to the amplifying unit 657 and the buffer 658, which are denoted by VDD3 and VSS3, respectively. The conductive types of the transistors P5-P10 are the same as the transistors Q5-Q10 of FIG. 3.

The exemplary embodiment of a level shifter 660 in FIG. 5 is operated in a manner corresponding to the exemplary embodiment of a level shifter 650 in FIG. 3. That is, when the second input signal CLKB transitions from about 3 V to about 0 V, e.g. T2, and the first input signal CLK transitions from about 0 V to about 3 V, e.g. T2, about 3 V is outputted to the contact n1 and about −3 V is outputted to the contact n3. In addition, when the second input signal CLKB transitions from about 0 V to about 3 V, e.g. T1, and the first input signal CLK transitions from about 3 V to about 0 V, e.g. T1, about 6 V is outputted to the contact n1 and about 0 V is outputted to the contact n3.

Accordingly, the amplifying unit 657 outputs a signal which reciprocates from about 6 V to about −3 V having the same phase as that of the first input signal CLK according to the voltage at the contacts ni1 and n3, and the buffer 658 stabilizes the output of the amplifying unit 657 and outputs it as an output signal of the level shifter 660.

Accordingly, by applying only the reciprocating voltage values of the output signal rather than applying a plurality of DC voltages to the level shifter 660, the output signal having the same phase as and the greater amplitude than that of the first input signal CLK can be obtained.

The exemplary embodiments of a level shifter according to the present invention can be easily applied for a different flat panel display device or an electrical device, as well as for the LCD or the OLED display.

Now, display devices according to another embodiment of the present invention will be described in detail with reference to FIGS. 6 and 7.

Figure 6:
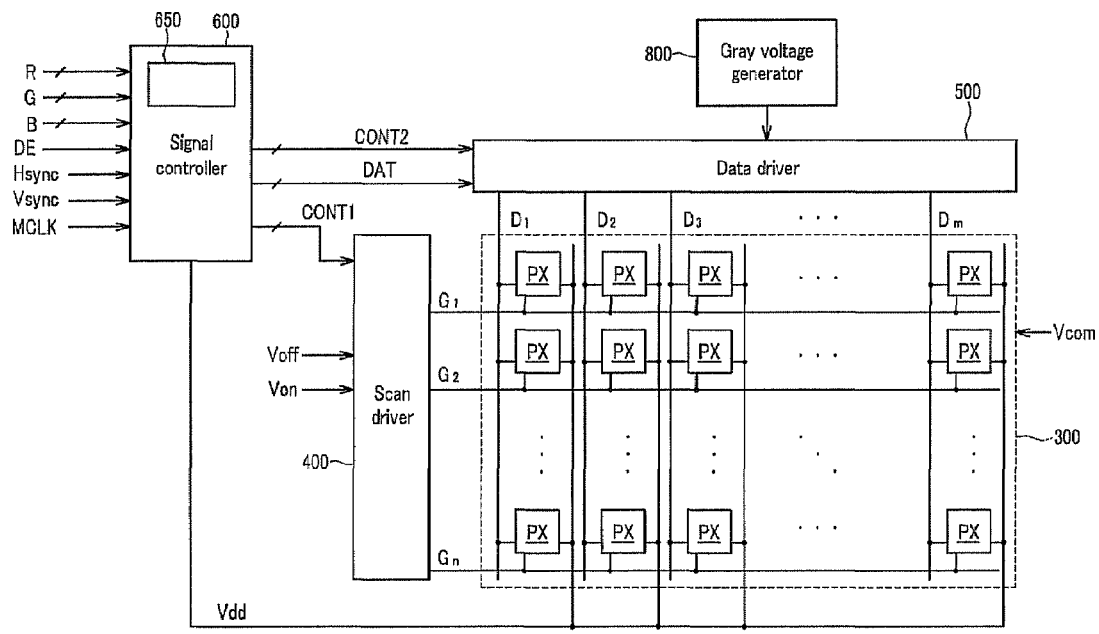
FIG. 6 is a schematic block diagram showing another exemplary embodiment of a display device according to the present invention.
Figure 7:
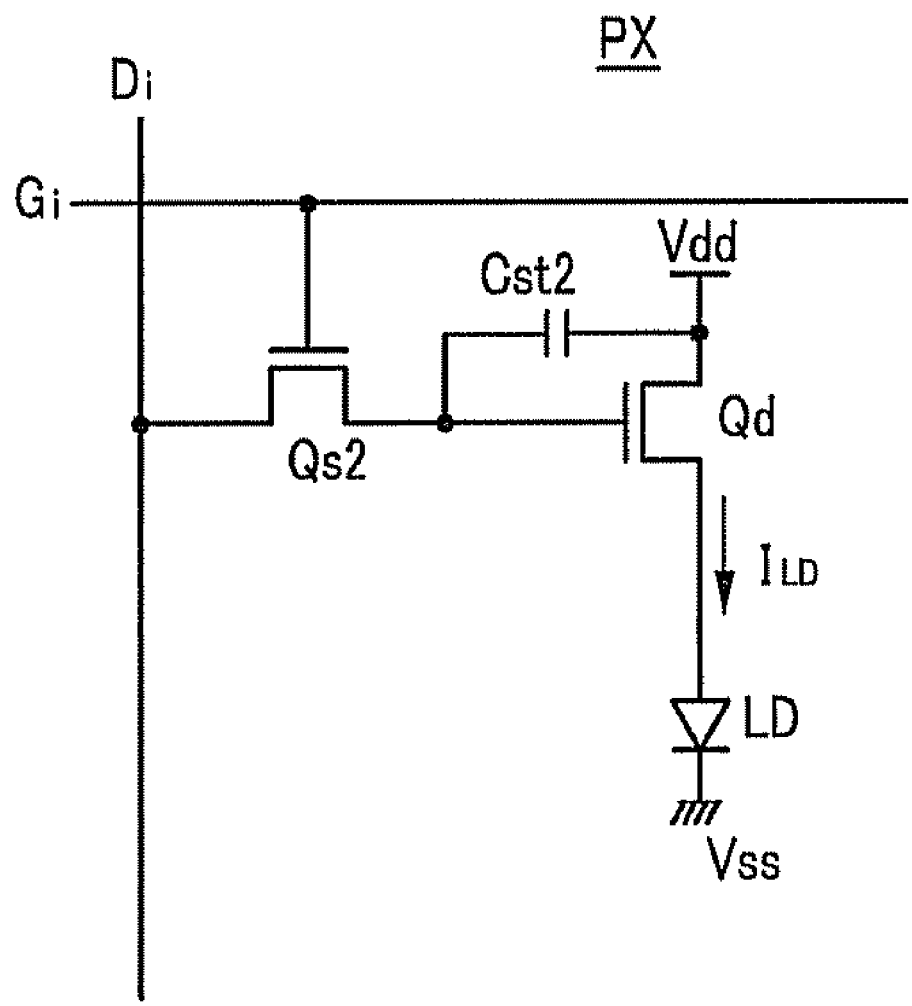
FIG. 7 is an equivalent circuit diagram of an exemplary embodiment of a pixel of an organic light emitting diode ("OLED") display according to the present invention.

FIG. 6 is a schematic block diagram showing another exemplary embodiment of a display device according to the present invention and FIG. 7 is an equivalent circuit diagram of an exemplary embodiment of a pixel of an organic light emitting diode ("OLED") display according to the present invention.

Referring to FIG. 6, an OLED display has almost the same circuit structure as that of FIG. 1. Namely, the OLED display includes a display panel 300, a scan driver 400 and a data driver 500 that are connected to the display panel 300, and a gray voltage generator 800. A signal controller 600 controls the above elements.

Compared with the LCD display as shown in FIG. 1, the OLED display in FIG. 6 includes a plurality of voltage lines. The voltage lines are substantially parallel to each other and transmit a driving voltage Vdd from the signal controller 600 to each pixel.

A pixel circuit of an organic light emitting diode ("OLED") display as shown in FIG. 7 includes an OLED LD, a driving transistor Qd, and a capacitor Cst2.

The driving transistor Qd is also a three-terminal element, including a control terminal, an input terminal, and an output terminal. The control terminal of the driving transistor Qd is connected with a switching transistor Qs2, the input terminal is connected with the driving voltage Vdd, and the output terminal is connected with the OLED LD. The driving transistor Qd outputs an output current $I_{LD}$, the magnitude of which changes depending on a voltage applied between the control terminal and the output terminal.

The capacitor Cst2 is connected between the control terminal and the input terminal of the driving transistor Qd. The capacitor Cst2 charges a data voltage applied to the control terminal of the driving transistor Qd through the switching transistor Qs2, and sustains it even after the switching transistor Qs2 is turned off.

The OLED LD includes an anode connected with the output terminal of the driving transistor Qd and a cathode connected with the common voltage Vss. The luminosity of the OLED LD varies depending on the magnitude of the output current $I_{LD}$. The OLED as shown in FIG. 7 emits one of the primary colors or white light according to the properties of the materials used to form the OLED LD.

Referring back to FIG. 6, the signal controller 600 controls the above elements and has the level shifter 650 as shown in FIGS. 3 to 5. The level shifter 650 generates with respect to the input signals CLK and CLKB, an output signal Vn7, whose amplitude as well as its voltage value has been increased, so a signal shifted in the positive and negative directions can be obtained without using a separate complementary circuit.

The scan driver 400 and/or the data driver 500 is driven according to the output signal Vn7 and generates the scanning signal and/or data voltage.

The switching transistor Qs2 is turned on when the scanning signal at a high level is supplied from the scan driver 400, thereby applying the analog data voltage to the control terminal of the driving transistor Qd. The driving transistor Qd outputs a driving current $I_{LD}$ corresponding to the analog data voltage to the organic light emitting element LD. Then, the organic light emitting element LD emits light corresponding to the supplied driving current $I_{LD}$. The operation as mentioned above is performed sequentially up to the pixels PX in the n-th row, thereby displaying an image.

As described above, according to the present invention, the output signal that has the same phase as the input signal but greater amplitude than the input signal can be obtained.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. A level shifter comprising:
   a signal conversion unit which receives a first input signal having a predetermined period and a second input signal which is an inversion of the first input signal,
   wherein the signal conversion unit comprises:
   a first conversion unit which outputs a first output signal through a first output terminal and comprises;
   a first transistor which transfers a first voltage to the first output terminal;
   a first capacitor which turns the first transistor on and off according to the second input signal; and
   a second capacitor which increases a voltage of the first output terminal according to the first input signal; and
   a second conversion unit which outputs a second output signal through a second output terminal and comprises;
   a second transistor which transfers a second voltage to the second output terminal;
   a third capacitor which turns the second transistor on and off according to the second input signal; and
   a fourth capacitor which reduces a voltage of the second output terminal according to the first input signal; and
   an amplifying unit which receives the first and second output signals and generates a third output signal having an amplitude greater than the first input signal,
   wherein the first conversion unit further comprises:
   a third transistor which transfers the first voltage to a third output terminal according to the voltage of the first output terminal; and
   the second conversion unit further comprises:
   a fourth transistor which transfers the second voltage to a fourth output terminal according to the voltage of the second output terminal, wherein the first output signal has substantially a same phase as the first input signal and having a voltage higher than the first input signal; and
   the second output signal has substantially a same phase as the first input signal and having a voltage lower than the first input signal; wherein the amplitudes of the first and second output signals are substantially the same as those of the first and second input signals, respectively; and wherein a minimum voltage level of the first output signal is the first voltage which is higher than a minimum voltage level of the first input signal, and a maximum voltage level of the second output signal is the second voltage which is lower than a maximum voltage level of the first input signal and lower than the first voltage.

2. The level shifter of claim 1, wherein the third output signal has substantially an inverse phase as the first input signal.

3. The level shifter of claim 1, wherein the first capacitor increases a voltage of the third output terminal according to the second input signal and the third capacitor lowers a voltage of the fourth output terminal according to the second input signal.

4. The level shifter of claim 1, wherein the amplifying unit comprises:
   a first switching transistor which transfers a third voltage according to the first output signal; and
   a second switching transistor which transfers a fourth voltage according to the second output signal,
   wherein the first and second switching transistors are alternately turned on and off.

5. The level shifter of claim 4, wherein the first and third transistors have a conductive type opposite to the conductive type of the second and fourth transistors.

6. The level shifter of claim 5, further comprising a buffer which receives the third output signal.

7. The level shifter of claim 6, wherein the first voltage is lower than the third voltage, the second voltage is higher than the fourth voltage, and the first and third transistors are n-type transistors.

8. The level shifter of claim 6, wherein the first and third voltages are substantially the same, the second and fourth voltages are substantially the same, and the first and third transistors are p-type transistors.

9. A level shifter comprising:
a pair of first capacitors connected in series and having first and second terminals;
a pair of second capacitors connected in series and having first and second terminals;
a first transistor having a control terminal connected with the first terminal of the pair of second capacitors, a first input/output terminal connected with a first voltage, and a second input/output terminal connected with the first terminal of the pair of first capacitors;
a second transistor which has a conductive type opposite the first transistor, and which has a control terminal connected with the second terminal of the pair of second capacitors, a first input/output terminal connected with a second voltage, and a second input/output terminal connected with the second terminal of the pair of first capacitors;
a third transistor having a control terminal connected with the first terminal of the pair of first capacitors, a first input/output terminal connected with a third voltage, and a second input/output terminal; and
a fourth transistor having a control terminal connected with the second terminal of the pair of first capacitors, a first input/output terminal connected with a fourth voltage, and a second input/output terminal connected with the second input/output terminal of the third transistor,
wherein a contact between the pair of first capacitors is connected with a first input signal and a contact between the pair of second capacitors is connected with a second input signal, wherein the second input signal is an inversion of the first input signal.

10. The level shifter of claim 9, further comprising:
a fifth transistor of substantially the same conductive type as the first transistor, and having a control terminal connected with the first terminal of the pair of first capacitors, a first terminal connected with a first voltage, and a second terminal connected with the first terminal of the pair of second capacitors; and
a sixth transistor of substantially the same conductive type as the second transistor, and having a control terminal connected with the second terminal of the pair of first capacitors, a first terminal connected with the second voltage, and a second terminal connected with the second terminal of the pair of second capacitors.

11. The level shifter of claim 10, wherein the first voltage is lower than a first reference voltage and the second voltage is higher than a second reference voltage, and the first and fifth transistors are n-type transistors.

12. The level shifter of claim 11, wherein the first voltage and the first reference voltage are substantially the same and the second voltage and the second reference voltage are substantially the same, and the first and fifth transistors are p-type transistors.

13. A method of driving a level shifter, comprising:
receiving a first periodic input signal;
receiving a second input signal, wherein the second input signal is an inversion of the first input signal;
generating a first output signal, wherein the first output signal has substantially a same phase as the first input signal and a voltage which is higher than the first input signal;
generating a second output signal, wherein the second output signal has substantially a same phase as the first input signal and a voltage which is lower than the first input signal according to the first and second input signals; and
receiving the first and second output signals and generating a third output signal which has substantially an inverse phase as the first input signal and an amplitude which is greater than the first input signal,
wherein the generating of the first output signal comprises:
transferring the first voltage to a first output terminal according to the second input signal; and
increasing a voltage of the first output terminal according to the first input signal, and
the generating of the second output signal comprises:
transferring the second voltage to a second output terminal according to the second input signal; and
reducing a voltage of the second output terminal according to the first input signal, wherein the amplitudes of the first and second output signals are substantially the same as those of the first and second input signals, respectively; and wherein a minimum voltage level of the first output signal is a first voltage which is higher than a minimum voltage level of the first input signal, and a maximum voltage level of the second output signal is a second voltage which is lower than a maximum voltage level of the first input signal and lower than the first voltage.

14. The method of claim 13, wherein the generating of the third output signal comprises:
transferring a third voltage according to the first output signal; and
transferring a fourth voltage according to the second output signal,
wherein the third and fourth voltages are alternately transferred.

15. A level shifter comprising:
a signal conversion unit which receives a first input signal having a predetermined period and a second input signal which is an inversion of the first input signal,
wherein the signal conversion unit comprises;
a first conversion unit which outputs a first output signal through a first output terminal and comprises;
a first transistor which transfers a first voltage to the first output terminal;
a first capacitor which turns the first transistor on and off according to the second input signal; and
a second capacitor which increases a voltage of the first output terminal according to the first input signal; and
a second conversion unit which outputs a second output signal through a second output terminal and comprises;
a second transistor which has a conductive type opposite to the first transistor and transfers a second voltage to the second output terminal;
a third capacitor which turns the second transistor on and off according to the second input signal; and
a fourth capacitor which reduces a voltage of the second output terminal according to the first input signal; and
an amplifying unit which receives the first and second output signals and generates a third output signal having an amplitude greater than the first input signal.

16. The level shifter of claim 15, wherein the first conversion unit further comprises:
a third transistor which has the same conductive type as the first transistor and transfers the first voltage to a third output terminal according to the voltage of the first output terminal; and the second conversion unit further comprises:

a fourth transistor which has a conductive type opposite to the third transistor and transfers the second voltage to a fourth output terminal according to the voltage of the second output terminal.

17. The level shifter of claim 16, wherein the amplifying unit comprises:

a first switching transistor which transfers a third voltage according to the first output signal; and a second switching transistor which transfers a fourth voltage according to the second output signal, wherein the first and second switching transistors are alternately turned on and off.

18. The level shifter of claim 17, further comprising a buffer which receives the third output signal.

19. The level shifter of claim 15, wherein the amplifying unit comprises:

a first switching transistor which transfers a third voltage according to the first output signal; and a second switching transistor which transfers a fourth voltage according to the second output signal, wherein the first and second switching transistors are alternately turned on and off.

* * * * *